United States Patent
Dreier et al.

[11] Patent Number: 6,119,768
[45] Date of Patent: Sep. 19, 2000

[54] OUTDOOR EQUIPMENT CABINET

[75] Inventors: Kenneth Dreier, Tyrone, Ga.; Marvin P. Garcia, Bloomingdale, Ill.

[73] Assignee: Marconi Communications, Inc., Warrenville, Ill.

[21] Appl. No.: 09/295,643

[22] Filed: Apr. 20, 1999

[51] Int. Cl.⁷ ................................................... H05K 7/20
[52] U.S. Cl. .................. 165/104.33; 165/103; 165/154; 361/696
[58] Field of Search .............................. 165/103, 104.33, 165/104.34, 154, 121, 122; 361/695, 696

[56] References Cited

U.S. PATENT DOCUMENTS

| | | | |
|---|---|---|---|
| 895,550 | 8/1908 | Fullerton | 165/103 |
| 1,278,035 | 9/1918 | Sexton | 165/102 |
| 2,067,560 | 1/1937 | Bollheimer | 165/102 |
| 2,823,026 | 2/1958 | D'Amico | 165/154 |
| 2,903,247 | 9/1959 | Kritzer | 165/154 |
| 4,949,218 | 8/1990 | Blanchard et al. | |
| 5,040,095 | 8/1991 | Beaty et al. | |
| 5,150,277 | 9/1992 | Bainbridge et al. | |
| 5,361,188 | 11/1994 | Kondou et al. | 361/695 |
| 5,365,749 | 11/1994 | Porter | |
| 5,424,925 | 6/1995 | Katooka et al. | 361/695 |
| 5,436,793 | 7/1995 | Sanwo et al. | |
| 5,570,740 | 11/1996 | Flores et al. | |
| 5,794,450 | 8/1998 | Alexander | |
| 5,823,005 | 10/1998 | Alexander et al. | |
| 5,832,988 | 11/1998 | Mistry et al. | |
| 6,000,623 | 12/1999 | Blatti et al. | 236/49.3 |
| 6,046,921 | 4/2000 | Tracewell et al. | 363/141 |

FOREIGN PATENT DOCUMENTS

| | | | |
|---|---|---|---|
| 2-205397 | 8/1990 | Japan | 361/695 |
| 4-170097 | 6/1992 | Japan | 361/695 |
| 6-21677 | 1/1994 | Japan | 361/695 |

*Primary Examiner*—Allen Flanigan
*Attorney, Agent, or Firm*—Jones, Day, Reavis & Pogue

[57] ABSTRACT

An outdoor equipment cabinet enclosure designed to effectively dissipate heat generated by electrical equipment components housed therein includes a main interior section for housing active electronic components and a lower section configured to store banks of batteries for a stand-by power supply system with a lower wall separating the batteries from the electronic components in the main interior section. At least one heat exchanger is disposed in the main interior section and includes an inlet port and means for creating a circulating air flow path for interior air within the main interior section. An outdoor air flow path is defined by the lower wall and the upper surfaces of the batteries and at least one baffle is disposed within the outdoor air flow path which is configured to deflect outdoor air flowing across the upper surfaces of the batteries into the at least one heat exchanger. The at least one baffle is disposed at an acute angle to the upper surfaces of the batteries from a point adjacent inwardly disposed sides of the batteries.

9 Claims, 2 Drawing Sheets

OUTDOOR EQUIPMENT CABINET

BACKGROUND OF THE INVENTION

1. Field of the Invention

The present invention relates generally to construction of an outdoor equipment cabinet and, more particularly, to a cabinet for containing electrical equipment components and which is designed to effectively dissipate heat generated by the components during operation.

2. Description of the Related Art

Many forms of electronic equipment, of necessity, must be located in an outdoor environment. Such equipment in typical form may be telecommunications and cable television equipment including active electronic and optical systems and passive cross-connect and splicing fields. It is essential that such equipment be protected from a wide range of ambient temperatures and inclement climatic conditions such as rain, snow, sleet, high winds, ice, and sand storms as well as other in situ environmental issues like seismic vibration, etc. To this end, cabinet enclosures have been developed to house such electronic equipment in a highly weather tight manner.

The type of electronic equipment that is typically housed in an outdoor cabinet enclosure is known to generate considerable amounts of heat in operation. Further, in many environments the ambient air can become very warm and heat up the air internal to the cabinet. This can have a deleterious effect on the electronic equipment and severely limit its effective life. Air conditioning systems and thermoelectric coolers, for example, are known that may be used in conjunction with outside equipment cabinets to aid in maintaining an acceptable temperature within the cabinet enclosure. However, such systems may not be cost-effective for all applications. An alternative approach is disclosed in U.S. Pat. No. 5,570,740 issued to Flores et al., which teaches a built-in cooling system for an enclosure. The Flores et al. cooling system utilizes a combination of a heat exchanger and a plenum to provide for both "internal air" and "external air." The heat exchanger is constructed to include a serpentine internal structure to maintain separation between the air flows. The external air enters at the bottom of the exchanger and flows upward and through the plenum. The internal air enters at the top of the exchanger and is pulled downward through a fan located near the bottom of the heat exchanger. The heat exchanger allows for considerable heat exchange between the relatively cool upward external air flow and the relatively warm downward internal air flow.

While the Flores et al. construction is effective in maintaining reduced temperature within electronic equipment cabinets, the heat exchanger unit disclosed therein is of somewhat of a complicated design that may not be suitable for many applications. Thus, simplified heat exchanger constructions have been proposed, such as that disclosed in Mistry et al., U.S. Pat. No. 5,832,988. Mistry et al. propose a nested columnar heat exchanger comprising an internal air flow column that receives outside air flow and a surrounding air flow column that functions to circulate and cool interior air. The Mistry et al. disclosure further contemplates the use of an adjustable diversion means that switches between two sources of external air, one source which functions to cool batteries contained within the cabinet.

While known apparatus for cooling air internal to an electronic equipment cabinet provides for a degree of effectiveness in serving a cooling function, it is desirable to provide a still improved means for cooling which is yet simpler and more cost-effective to construct. Further, it is desirable to provide such a means which can be used to cool batteries in an equipment cabinet without any moving parts. Still further, it is desirable to provide such a means which serves an additional function of positively locating batteries in a cabinet and retaining them against such occurrences as seismic events or other cabinet vibration. Yet further, it is desirable to provide for natural venting of gases generated by associated batteries without reliance on fans.

SUMMARY OF THE INVENTION

The present invention improves over the prior art by providing an outdoor equipment cabinet enclosure including a main interior section for housing active electronic components and a lower section for housing stand-by batteries. A lower wall separates the lower section from the main section. One or more heat exchangers are disposed within the main interior section between the lower wall and the roof of the enclosure. Two outdoor air flow paths are defined by the lower wall and upper surfaces of the batteries. A pair of adjacent, oppositely directed baffles are disposed respectively within one of the outdoor air flow paths and are configured to deflect outdoor air flowing across the upper surfaces of the batteries into interior columns of the heat exchangers. The baffles are each disposed at an acute angle to the upper surfaces of the batteries from points adjacent inwardly disposed sides of the batteries. Thus, entry of relatively cool external air to the heat exchangers is maximized. The baffles also serve to locate and retain the batteries within the enclosure against the advent of vibration or other cabinet movement.

BRIEF DESCRIPTION OF THE DRAWINGS

The foregoing and other novel features and advantages of the invention will be better understood upon a reading of the following detailed description taken in conjunction with the accompanying drawing wherein.

DETAILED DESCRIPTION OF THE PREFERRED EMBODIMENT

Figure 1:
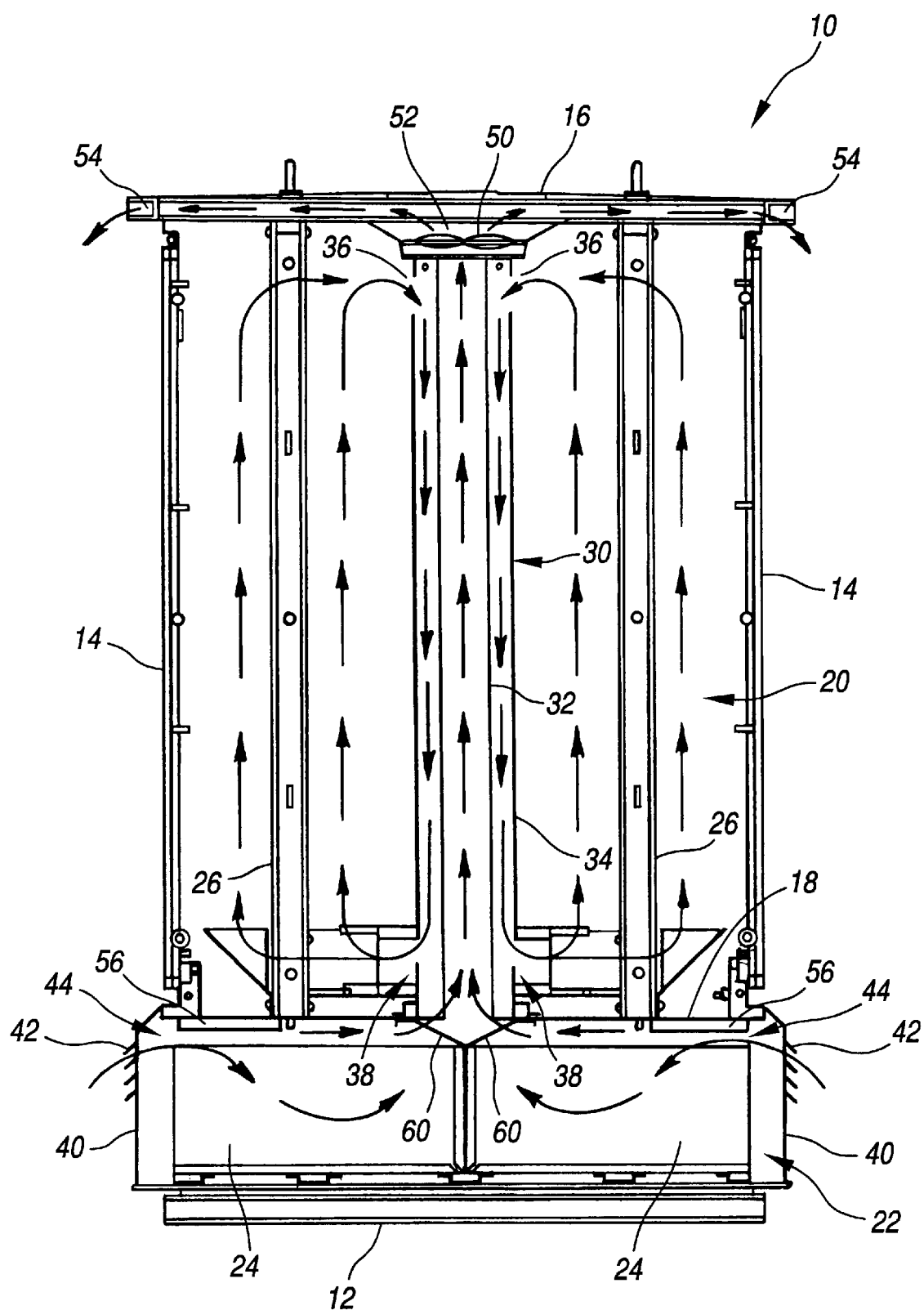
FIG. 1 is a side schematic view of an outdoor equipment cabinet constructed in accordance with the principles of the invention.

Referring now to the drawings, and initially to FIG. 1, an outdoor equipment cabinet enclosure is shown schematically in side view and designated generally by the reference numeral 10. The cabinet 10 includes as its principal components a base 12, opposed side walls 14 and an interconnected roof 16. In a manner well-known in the art the side walls 14 may be fitted with suitable doors for access to the interior of the cabinet 10. The cabinet 10 includes a lower wall 18 which divides the cabinet 10 into an upper chamber 20 and a lower chamber 22. The upper chamber 20 is dimensioned and configured to house active electronic components (not shown) while the lower chamber 22 is dimensioned and configured to house two opposed banks of back-up power supply batteries 24. Suitable environment rails 26 may be provided to strengthen the cabinet 10 and provide for the mounting of internal equipment components.

Positioned centrally of the cabinet 10 and extending between the lower wall 18 and roof 16 are one or more heat exchangers 30 (only one of which can be seen). The heat exchangers 30 are of the counterflow air type each comprising an inner column 32 surrounded by an outer column 34 slightly spaced from the inner column 32. The outer column 34 is provided with upper intake ports 36 which, by convection, receive relatively warm air from inside the chamber 20 and allow the air to pass downwardly between the columns 32 and 34 to lower exhaust ports 38. The lower chamber 22 is provided with covers 40 having vents 42 formed therein. The position of the lower wall 18 is such as to define an air passageways 44 between the upper surfaces of the batteries 24 and the bottom surface of the wall 18. An opening in the bottom of the inner column 32 communicates with the passageways 44 and a fan 50 is disposed at the top of the column 32. The column 32 thus communicates at its upper end with a plenum 52 formed in the roof 16 having exhaust ports 54. By this configuration, external air is drawn through the vents 42, thence through the passageways 44 and into the inner column 32 where it is forced out through the roof 16 by the fan 50.

Figure 2:
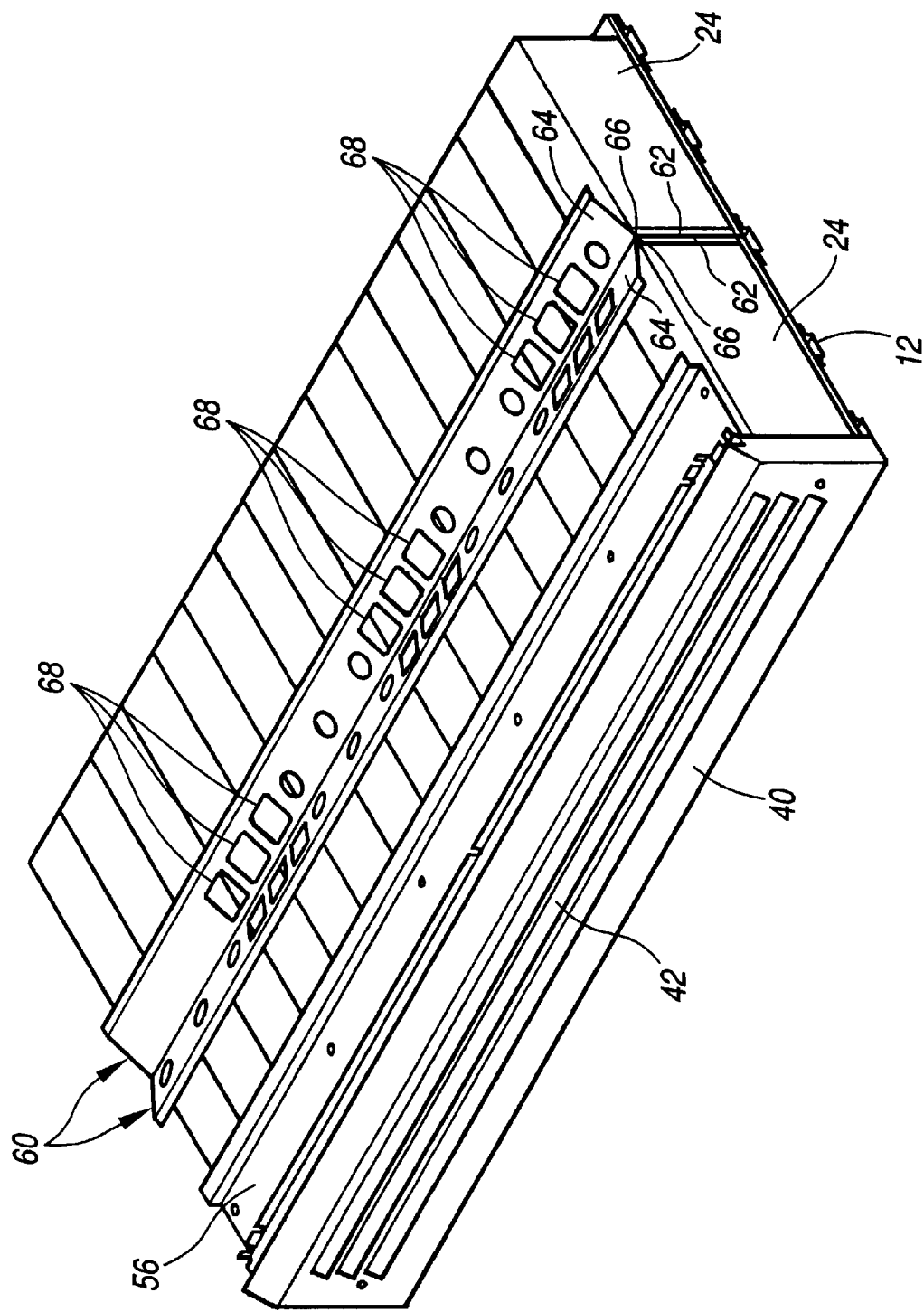
FIG. 2 is an isometric view of a bottom platform for an equipment cabinet illustrating a baffle arrangement constructed according to the invention.

A pair of elongate diverters 56, only one of which can be seen in FIG. 2, are positioned within the passageways 44. The diverters 56 serve to divert relatively cool external air through spaces between the batteries 24 and thus help cool the batteries 24 as well as achieve better managed air flow. The diverters 56 may be constructed as upwardly open channels to serve the dual purpose of acting as cable troughs. It can be appreciated that relatively cool external air being drawn through the inner column 32 will cool the internal air and cause the internal air to circulate within the chamber 20 by convection. The heat exchangers 30 may be constructed of extruded or embossed aluminum, brass or plastic to aid in heat transfer.

In accordance with the invention a pair of opposed baffles 60 are provided running the length of the cabinet 10 and positioned beneath the heat exchangers 30 in the path of the passageways 44. As best seen in FIG. 2, the baffles are constructed from stamped and formed sheet metal having upwardly extending portions 62 attached to the base 12 of the cabinet 10, and outwardly directed angled portions 64 each defining a bend 66. The baffles 60 are provided with apertures 68 configured to communicate with the inner columns 32 of the heat exchangers 30. The baffles 60 serve to effectively divert external air flowing through the passageways 44 into the inner columns 32 of the heat exchangers 30.

It can now be appreciated that an equipment cabinet 10 constructed in accordance with the invention provides for a low cost means for cooling active electronic components contained within the cabinet 10 without the need for complex manufacturing and assembly techniques. The novel configuration of the baffles 60 serves to effectively divert external air drawn over the upper surfaces of the batteries 24 into the heat exchangers 30. The batteries 24 are thereby cooled by the external air. In addition, the angled configuration of the baffles 60 wherein bends 66 are provided in close proximity to the rear upper edges of the batteries 24 serves the dual purpose of properly locating the batteries 24 with the lower chamber 22 of the cabinet 10 and positively retaining the batteries 24 against seismic events or other cabinet vibration. Preferably for maximum effectiveness, the baffles 60 are directed outwardly from the center of the cabinet 10 at an angle in a range of between twenty-five to forty degrees from a plane including the upper surfaces of the batteries 24. This assures maximum unimpeded air flow through the passageways 44 and into the heat exchangers 30. It can also be appreciated that while the invention has been described in connection with counter-flow type heat exchangers, other forms of heat exchangers such as cross-flow or heat pipe type heat exchangers will perform equally well. Further, it will be appreciated that in the event the fans 50 are not operational, the cabinet 10 has the capability of being self-venting by chimney effect. This offers the important advantage of assuring venting of potentially explosive gases generated by the batteries 24 situated within the cabinet 10.

While the present invention has been described in connection with a preferred embodiment thereof, it will be apparent to those skilled in the art that many changes and modifications may be made without departing from the true spirit and scope of the present invention. Accordingly, it is intended by the appended claims to cover all such changes and modifications as come within the spirit and scope of the invention.

What is claimed is:

1. An outdoor equipment cabinet enclosure comprising:
   a main interior section defined by side walls, a lower wall and a roof for housing active electronic components;
   a lower section of said enclosure configured to store banks of batteries for a standby power supply system wherein said lower wall separates said batteries from said electronic components;
   at least one heat exchanger disposed centrally of said main interior section and extending vertically between said lower wall and said roof, said heat exchanger including an inlet port and means for creating a circulating air flow path for interior air within the main interior section;
   an outdoor air flow path defined by said lower wall and upper surfaces of said batteries; and
   at least one baffle disposed within the outdoor air flow path and configured to deflect outdoor air flowing across upper surfaces of the batteries and into the at least one heat exchanger, said at least one baffle being disposed at an acute angle to the upper surfaces of the batteries from a point adjacent inwardly disposed sides of the batteries.

2. The enclosure of claim 1 including a fan disposed within the interior column of the at least one heat exchanger.

3. The enclosure of claim 1 including an exhaust air flow path within the roof, the enclosure configured to exhaust air from the interior column of the heat exchanger to at least one edge of the roof.

4. The enclosure of claim 1 including a pair of baffles disposed adjacent one another and facing in opposite directions.

5. The enclosure of claim 1 including a plurality of heat exchangers spaced from one another along the length of the enclosure.

6. The enclosure of claim 1 wherein said at least one baffle is disposed at an angle of in a range of twenty-five to forty degrees from a plane including upper surfaces of said batteries.

7. The enclosure of claim 1 wherein said at least one baffle includes an upwardly directed portion and an angled portion defining a bend and said bend is disposed proximate rear upper edges of said batteries to retain said batteries within said cabinet.

8. The enclosure of claim 1 including at least one diverter disposed within said outdoor air flow path for diverting outdoor air through spaces between said batteries.

9. The enclosure of claim 8 wherein said at least one diverter is configured as an upwardly open channel to thereby serve as a cable trough.

* * * * *